United States Patent [19]
Sudoh et al.

[11] Patent Number: 5,352,925
[45] Date of Patent: Oct. 4, 1994

[54] SEMICONDUCTOR DEVICE WITH ELECTROMAGNETIC SHIELD

[75] Inventors: Toru Sudoh, Sendai; Mikio Takano, Ohme, both of Japan

[73] Assignees: Kokusai Electric Co., Ltd.; Goyo Electronics Co., Ltd., Tokyo, Japan

[21] Appl. No.: 857,420

[22] Filed: Mar. 26, 1992

[30] Foreign Application Priority Data

Mar. 27, 1991 [JP] Japan .................. 3-085864
Mar. 27, 1991 [JP] Japan .................. 3-085865

[51] Int. Cl.$^5$ ............................. H01L 23/02
[52] U.S. Cl. .................. 257/659; 257/687; 257/787
[58] Field of Search ......... 257/706, 787, 659, 687; 174/52

[56] References Cited

U.S. PATENT DOCUMENTS 4,147,889  4/1979  Andrews et al. ............... 174/52
4,551,746  11/1985  Gilbert et al. ............... 257/706

FOREIGN PATENT DOCUMENTS

0421343  4/1991  European Pat. Off. .
87201702  6/1989  Japan .

Primary Examiner—William Mintel
Assistant Examiner—Roy Potter
Attorney, Agent, or Firm—Sixbey, Friedman, Leedom & Ferguson

[57] ABSTRACT

A single or a plurality of semiconductor chips or thin film elements which are bare or passivated to a minimum extent are housed in an enclosure member formed by drawing into the shape of a tray from a laminate consisting of an insulation layer and a first and second conductive layers formed on opposite sides, respectively, of the insulation layer. The enclosure member has a concavity having a substantially flat bottom and circumferential edge. There are provided on the inner surface of the concavity as extended to the circumferential edge, wiring conductors which are destined for connecting the terminal electrodes of the semiconductor chip or the like to the terminal electrodes corresponding to electronic parts on a circuit board, while the outer surface of the concavity is held at the ground potential to form an electromagnetic shield. The semiconductor chip or the like is connected to one end of the wiring conductor by the wire bonding process and resin-molded in the concavity. Since the semiconductor chip or the like is resin-molded in the enclosure member having the electromagnetic shield formed integrally therewith and the wiring conductors are extended to the substantially flat circumferential edge, a leadless package is formed which can be surface-mounted on a circuit board with the face thereof down.

9 Claims, 5 Drawing Sheets

SEMICONDUCTOR DEVICE WITH ELECTROMAGNETIC SHIELD

BACKGROUND OF THE INVENTION a) Field of the Invention

The present invention relates to a semiconductor device with an electromagnetic shield, and more particularly, to a leadless package destined for housing a single or a plurality of semiconductor chips or thin film elements which are bare or passivated to a minimum extent or for housing a circuit board on the inner side of which there is surface mounted a plurality of electronic parts.

b) Description of the Prior Art

Among the packages for having mounted therein semiconductor chips such as IC, LSI, etc., plastic packages and ceramic packages have recently been used most widely. Among others, many plastic leadless chip carriers (PLCC) and ceramic chip carriers are used for surface-mounting of such electronic parts. For mounting such plastic molded semiconductor chips on a printed wiring board and using the circuit board as installed in various electronic apparatuses, it is necessary to make an arrangement for preventing the the semiconductor chip from being adversely affected by a noise caused due to an electromagnetic wave produced by adjacent electronic parts, electric circuit or external environment, and also for preventing an electromagnetic wave produced by such semiconductor chip itself from adversely affecting the circuits and electronic parts surrounding the semiconductor chip. To this end, the above-mentioned semiconductor chip used to be covered with a separately formed metallic shield to shield the semiconductor chip against the electromagnetic wave. To provide such a shielding structure for the semiconductor chip, however, an installation space and wiring of grounding conductor are necessary, which causes the packaging density to be lower, installed height of parts to be greater and thus the manufacturing costs to be larger.

A plurality of electronic parts mounted on a printed wiring board used to be electromagnetically shielded by installing to the printed wiring board a shielding case made of a metal having a high electromagnetic shielding performance so as to enclose the electronic parts. Since this is limited in packaging density, compact and lightweight design, however, a shielding structure has been proposed owing to which electronic parts may not always be mounted on the printed wiring board.

For example, the Japanese Unexamined Patent Publication No. 61-166200 discloses a hybrid IC device which has a case formed by a flexible wiring board having a copper foil formed on either side thereof and an insulation layer between these front and rear sides thereof and which is so bent as to enclose electronic parts on the wiring board, the case having mounted on the inner side thereof electronic parts forming a circuit and the outer side being held at ground potential to form an electromagnetic shield. In such hybrid IC device, however, the shielding case formed from the flexible wiring board bent to enclose the electronic parts is inserted in a slot in the printed circuit board and fixed by soldering at the rear side of the printed circuit board. Namely, the electronic parts cannot be mounted on the surface. Also, since the shielding case is formed from a bent flexible wiring board, the shielding case cannot be improved in shape stability and vibration resistance unless a resin is charged in the case after bent.

Also the Japanese Unexamined Utility Model Publication No. 63-149599 discloses a shielding case made of a non-conductive material having a metallic layer formed on either side thereof, the inner side having formed on the metallic layer thereof a circuit pattern on which electronic parts are to be mounted. In this shielding case, the outer metallic layer provides a shielding surface and also a grounding surface. Such as shielding case is mounted on the surface of a printed wiring board. When the circuit pattern formed on the metallic layer on the inner side of the shielding case and the electronic parts on the printed circuit board outside the shielding case are connected as soldered to each other, the higher the packaging density inside the case, the shorter the distance between the connecting terminals connecting the inner and outer sides of the case is (the terminals are to be disposed at a finer pitch). Thus the melted solder will bridge the adjacent connecting terminals, possibly causing a short-circuit.

SUMMARY OF THE INVENTION

The present invention has an object to overcome the above-mentioned drawbacks of the prior art by providing a semiconductor device having an electromagnetic shield formed therewith.

The present invention has another object to provide a semiconductor device comprising a leadless package having an electromagnetic shield formed integrally therewith and which is destined for housing a single or a plurality of semiconductor chips or thin film elements which are bare or passivated to a minimum extent.

The present invention has a further another object to provide a semiconductor device comprising a leadless package highly mass-producible, having an electromagnetic shield formed integrally therewith and which is destined for housing a leadless package for semiconductor chips or thin film elements.

The present invention has a still another object to provide a semiconductor device having an electromagnetic shield formed integrally therewith, in which during surface-mounting to a printed circuit board, a short-circuit due to flow of melted solder to adjacent connecting terminals can be prevented and the surface-mounting can be done by an automatic mounting machine.

The present invention has a yet another object to provide a semiconductor device comprising a leadless package having an electromagnetic shield and which is destined for housing a plurality of electronic parts mounted on both sides of a circuit board and which comprises a leadless package which can be surface-mounted on a motherboard.

The present invention has a still yet another object to provide a semiconductor device comprising a leadless package having an electromagnetic shield for a plurality of electronic parts mounted on both sides of a circuit board, in which during surface-mounting to a printed circuit board, a short-circuit due to flow of melted solder to adjacent connecting terminals can be prevented and the surface-mounting can be done by an automatic mounting machine.

The above and other objects of the present invention will be apparent by those skilled in the art from reading of the following detailed description of the disclosure found in the accompanying drawings and novelty thereof pointed out in the appended claims.

BRIEF DESCRIPTION OF THE DRAWINGS

FIGS. 5(*a*) and 5(*b*) are schematic diagrams, enlarged in scale, of the portions A and B in FIG. 4;

DETAILED DESCRIPTION OF THE PREFERRED EMBODIMENTS

Figure 1:
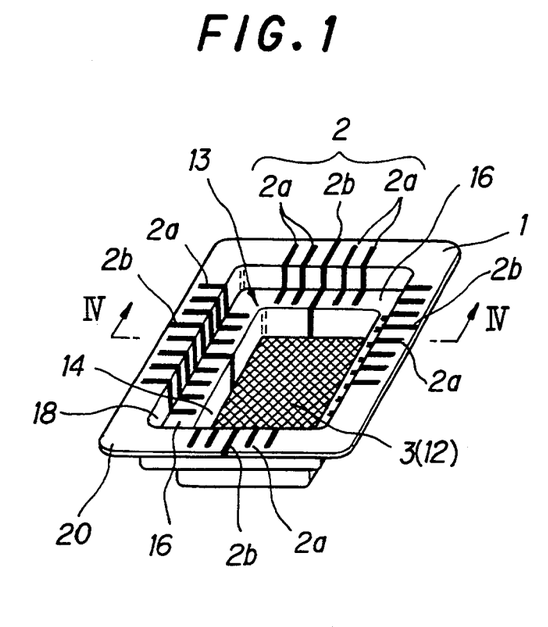
FIG. 1 is a schematic perspective view of one embodiment of the semiconductor device having an electromagnetic shield according to the present invention, showing, as enlarged in scale, an enclosure member forming a leadless package for a single semiconductor chip which is bare or passivated to a minimum extent.
Figure 2:
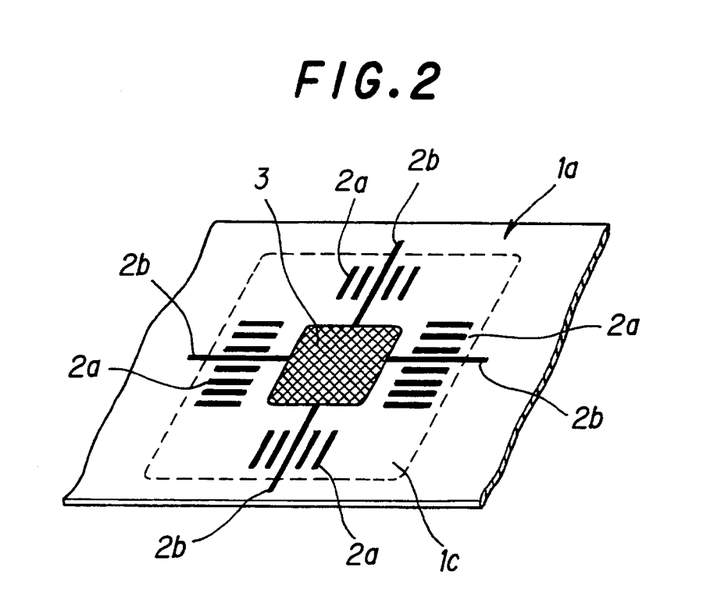
FIG. 2 is a schematic diagram showing the pre-worked state of the enclosure member in FIG. 1.
Figure 3:
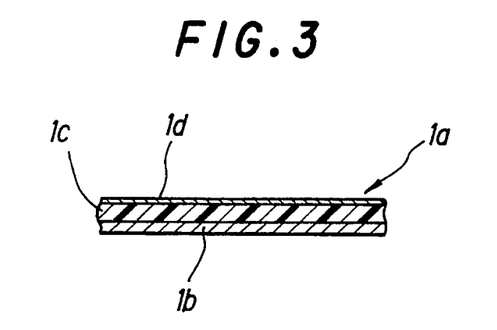
FIG. 3 is a sectional view, enlarged in scale, of a multi-layer wiring board having a metal base and which composes the enclosure member.

One embodiment of the semiconductor device having an electromagnetic shield according to the present invention will be described herebelow with reference to FIGS. 1 to 8. This embodiment comprises a leadless package for housing a bare semiconductor chip. In FIG. 1, the reference numeral 1 indicates a leadless package body or enclosure member which houses a bare semiconductor chip which will be discussed later. To obtain the enclosure member 1, a printed wiring board 1*a* is made by punching along the dash line a flat-sheet metal-base substrate on one side of which there are already formed, by etching, wiring conductors 2 and a grounding conductor 3 which will be further discussed later and then the board 1*a* is formed into a shallow tray by drawing being one of the pressing techniques. The metal-base wiring board 1*a* in this embodiment has a three-layer structure consisting of an aluminum film 1*b*, polyimide resin 1*c* and copper foil 1*d* as shown in FIG. 3. Namely, the polyimide resin 1*c* is attached between the aluminum film 1*b* and copper foil 1*d*. The wiring conductors 2 and grounding conductor 3 are formed on the copper foil 1*d* of the metal-base wiring board 1*a* as shown in FIG. 2. Therefore, the inner surface of the enclosure member 1 is formed by the wiring conductors 2, grounding conductor 3 and the polyimide resin 1 on which the conductors 2 and 3 are formed, while the the entire aluminum film 1*b* as outer surface of the enclosure member 1 forms an electromagnetic shielding surface.

In this embodiment, the aluminum film 1*b* as the outer surface is 0.2 mm thick, the polyimide resin 1*c* as the intermediate layer is 40 $\mu$m and the copper foil 1*d* as the inner surface is 35 $\mu$m. However, the thickness of these layers should preferably be selected so that during forming, by drawing, of the enclosure member 1 into the above-mentioned form of a shallow tray, the polyimide resin 1*c* and copper foil 1*d* will not peeled off the aluminum film 1*b*; the insulation layer thickness should range from 20 to 60 $\mu$m, the copper foil thickness range from 18 to 20 $\mu$m and the base metal thickness range from 0.1 to 3.0 mm.

In this embodiment, the aluminum film is used as base metal in view of its drawability, but for a better effect of shielding, a metal of Fe or Cu family should preferably be used for the base metal. Since it needs no rust-proofing treatment, nickel silver should preferably be used. Further, the insulation layer may be made of a resin in an epoxy family in stead of the polyimide family.

Figure 7:
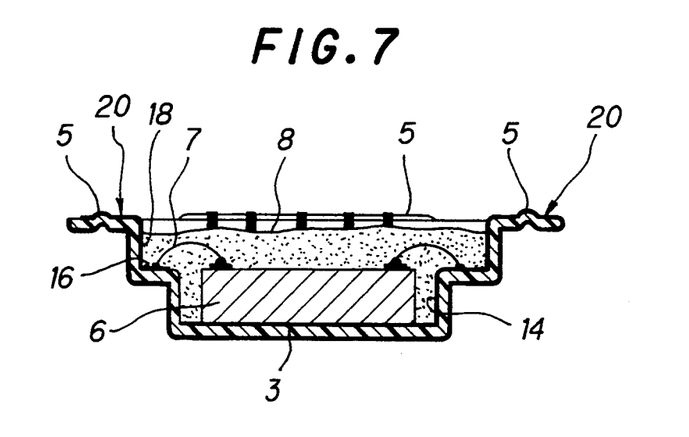
FIG. 7 is a schematic sectional view showing the semiconductor chip molded in a resin mold in the enclosure member.

The inner surface of the tray-like enclosure member 1 has a substantially flat bottom 12 on which grounding conductor 3 is formed, a first wall 14 rising from the circumferential edge of the bottom 12, a step 16 contiguous to the first wall 14 and substantially parallel to the bottom 12, a second wall 18 rising from the circumferential edge of the bottom 14, and a circumferential edge 20 continuous to the second wall 18 and substantially parallel to the bottom 14. A portion of a concavity 13 defined by the bottom 12, first wall 14, step 16 and second wall 18, that is, a concavity defined by the bottom 12 and second wall 14, has a substantial volume for housing the bare semiconductor chip 6. The level of the step 16 is nearly coincident with the top of the bare semiconductor chip 6 when housed in the enclosure member 1 as joined to the grounding conductor 3. Multiple wiring conductors 2*a* corresponding to the terminal electrodes of the bare semiconductor chip 6 are provided in parallel to each other on the step 16, second wall 18 and circumferential edge 20. Each of these wiring conductors 2*a* has one end thereof disposed on the step 16 while the other end is disposed on the circumferential edge 20. The one end of the wiring conductor 2*a* on the step 16 is to be electrically connected to the terminal electrode of the bare semiconductor chip 6 by means of a thin wire 6 made of Au or Al by the wire bonding method, while the other end on the circumferential edge 20 is to be electrically connected by soldering to a printed wire (not shown) on a circuit board 9 which will be further discussed later, namely, the bare semiconductor chip 6 is surface-mounted with the face down. The bare semiconductor chip 6 and fine wire 7 thus electrically connected are buried in a mold resin 8 by the drip coating method as shown in FIG. 7. In this embodiment, the step 16 is formed on the inner surface of the enclosure member 1 so that the terminal electrode of the bare semiconductor chip 6 is efficiently electrically connected to the wiring conductor 2*a* by wire bonding, but the step 16 is unnecessary depending upon the type of the semiconductor chip used.

Also the four wiring conductors 2*b* extending from the grounding conductor 3 formed on the bottom 14 run over the step 16, second wall 18 and circumferential edge 20 and are electrically connected to the aluminum film 1*b*. These ground wiring conductors 2*b* are so formed on the metal-base wiring board 1a as to have a length over the cutting line indicated with a dash line as shown in FIG. 2. When the metal-base wiring board 1a is cut as punched along the cutting line, the ground wiring conductors 2b pressed and remain as not cut off but as joined to the outer surface of the enclosure member, that is, the aluminum film 1b. This is shown as enlarged in scale in FIG. 5(b). Because of such punching, the wiring for grounding the aluminum film 1b as electromagnetic shield becomes unnecessary. A plurality of conductors 2a for connection to the terminal electrodes of the bare semiconductor chip 6 are formed somewhat short of the cutting line so that they do not remain not cut off when the metal-base wiring board 1a is cut. This is shown as enlarged in scale in FIG. 5(a). As shown, the polyimide resin 1c is exposed at the position indicated with 4 to provide a mutual isolation the wiring conductor 2a and the aluminum film 1b forming the outer surface of the enclosure member 1.

In Figures, only 22 wiring conductors 2a disposed in parallel to each other and 4 grounding conductors 2b are shown for the simplicity of illustration. Actually, however, for example, 60 (=15×4) conductors are disposed corresponding to the number of terminal electrodes of the bare semiconductor chip 6. In this case, 52 (=13×4) wiring conductors 2a are disposed and 8 (=2×4) grounding conductors 2b are disposed. The conductor width and pitch at one end on the step 16 are smaller than those at the other end on the circumferential edge 20. At the one end on the step 16, the conductor width and pitch are, for example, 0.2 mm and 0.4 mm, respectively, and those at the other end on the circumferential edge 20 are 0.3 mm and 0.7 mm, respectively.

Figure 4:
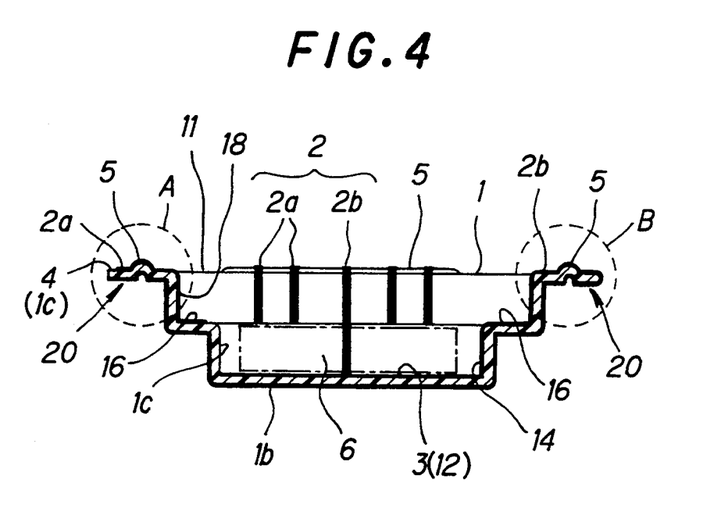
FIG. 4 is a sectional view, enlarged in scale, taken along the line IV—IV in FIG. 1.
Figure 5A:
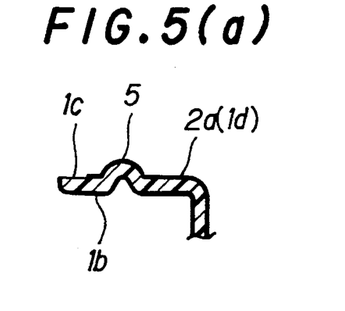
Figure 5B:
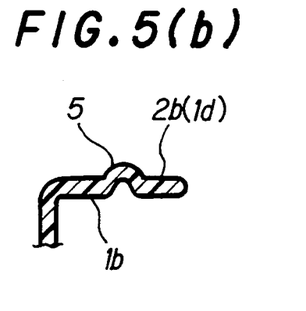
Figure 8:
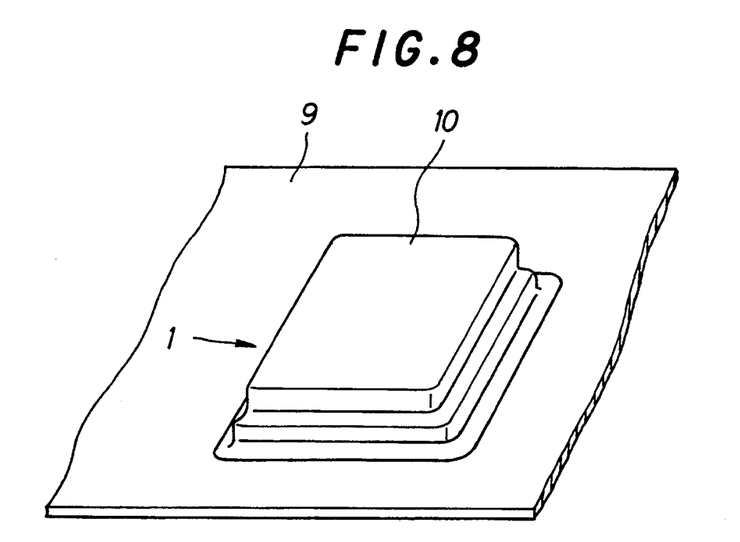
FIG. 8 is a schematic diagram showing the surface-mounting of the leadless package body on a printed circuit board.

A semiconductor device having a large number of wiring conductors 2a and grounding conductors 2b formed on the circumferential edge 20 of the enclosure member 1 is disposed on printed wires with the opening 13 thereof down to electrically connect the conductors to the printed wires of the circuit board 9 by the reflow soldering process. A mean for assuring ample physical contact and electrical connection between the other ends of the wiring conductors 2a and the printed wires. This means will be described herebelow. The circumferential edge 20 of the enclosure member 1 has a projection 5 extending in a direction perpendicular to the wiring conductors 2 as shown in FIGS. 4 and 5. Owing to these projections 5, the wiring conductors 2 are in substantial line contact with the printed wires (not shown) on the circuit board 9 to provide a satisfactory electrical connection between them when the enclosure member 1 is surface-mounted on the circuit board 9 with the face thereof down as shown in FIG. 8. The printed wires on the circuit board 9 have a cream solder already applied as printed in positions corresponding to the wiring conductors 2. The entire enclosure member 1 disposed on the circuit board 9 is moved for a predetermined time through a heating zone, so that the cream solder is melted, flows toward the surface of the projections 5 on the corresponding wiring conductors and is set there. More particularly, the practical advantage of the projection 5 provided along the circumferential edge of the enclosure member 1 is that it can securely maintain the physical contact between the wiring conductors 2 and printed wires on the circuit board 9 even when the enclosure member 1 is moved in the heating zone and make it easier for an excess melted solder to escape in a direction perpendicular to the extending direction of the projection 5 than in case the surface of contact between the wiring conductors 2 and the printed wires on the circuit board 9 is flat.

Figure 6:
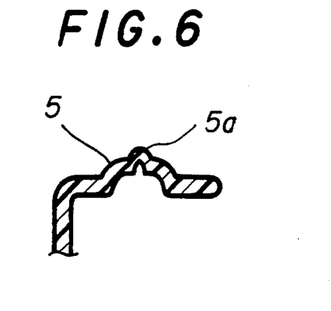
FIG. 6 is a schematic diagram, enlarged in scale, showing the convex portion formed along the circumferential edge of the enclosure member.

As shown in FIG. 6, the projection 5 may have formed on the end thereof a smaller projection 5a corresponding to each wiring conductor 2. These small projections 5a are substantially semispheric and have a smaller curvature than that of the projection 5, so that the wiring conductor 2 can be in substantial point contact with the printed wire on the circuit board 9. Thus, the practical advantage of the small projection 5a on the end of the projection 5 can be found in case there are provided a large number of wiring conductors 2 and thus the distance between the adjacent wiring conductors is short, namely the wiring conductors are disposed with a fine pitch. The excess melted solder can escape easily in the extending direction of the projection 5 as well as in a direction perpendicular to the extending direction, whereby it is possible to prevent a solder bridge from being formed between the wiring conductors.

In the embodiment having been described above, a single enclosure member 1 is formed from a single flat metal-base wiring board 1a. However, it is apparent to those skilled in the art that a plurality of enclosure members can be formed from a single metal-base wiring board 1a in practice. Namely, a plurality of conductor patterns shown in FIG. 2 is formed as etched on the copper foil 1d of a single metal-base wiring board 1a beforehand, the metal-base wiring board 1a is cut by punching along the dash-line to form a plurality of wiring boards. These wiring boards are drawn into enclosure members each having the form of a shallow tray. Namely, this method assures a high mass-producibility of such enclosure member.

The enclosure member 1 has formed grounding conductors 3 formed on the bottom 12 thereof. However, it is of course that the grounding conductors 3 are not necessary depending upon the type of the semiconductor chip 6. And many wiring conductors 2 are disposed along the whole circumferential edge of the enclosure member 1. Depending upon the type of the semiconductor chip 6, however, the wiring conductors 2 are disposed along one to three of the four circumferential edges of the enclosure member 1 as the case may be. In this case, grounding conductors 2b may be appropriately disposed on the other circumferential edge or all the other circumferential edges may be formed as grounding conductor in order to enhance the joining strength and shielding effect when the enclosure member is surface-mounted.

As having been described in the foregoing, a bare semiconductor chip is buried in an enclosure member having itself an electromagnetic shield, so that the semiconductor device needs no separate shielding means as in the prior art. Thus the packaging density is considerably improved, the number of parts is reduced and manufacturing costs can be noticeably decreased. Furthermore, many identical leadless packages can be formed from an extremely thin metal-base wiring board. That is, such leadless packages can be produced with a high mass-producibility. Since the leadless package is so constructed as to be surface-mounted with the face down, the flat bottom thereof conveniently receives a part or parts, so such leadless packages can be automatically transported from one to another station and mechanically mounted on a circuit board.

In the foregoing, a semiconductor device including a leadless package for a bare semiconductor chip has been described, but it should be noted that the semiconductor device according to the present invention includes a leadless package for base semiconductor chips such as IC, LSI, etc. as well as for thin film elements including thin-film L, C and R elements or combinations of them.

Figure 9:
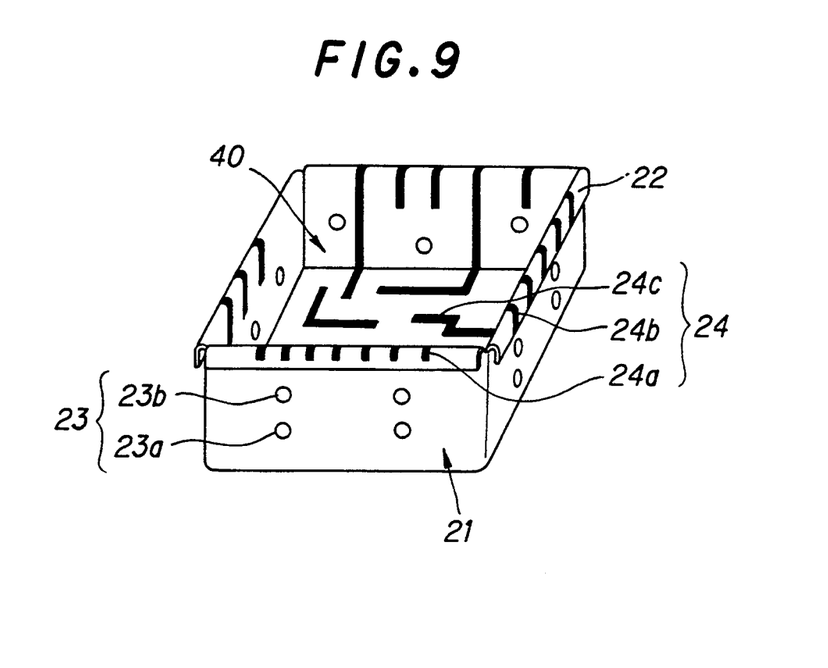
FIG. 9 is a schematic perspective view of another embodiment of the semiconductor device having an electromagnetic shield according to the present invention, showing, as enlarged in scale, an enclosure member composing a leadless package formed for surface-mounting on a motherboard of a circuit board on both sides of which a plurality of electronic parts is mounted.
Figure 10:
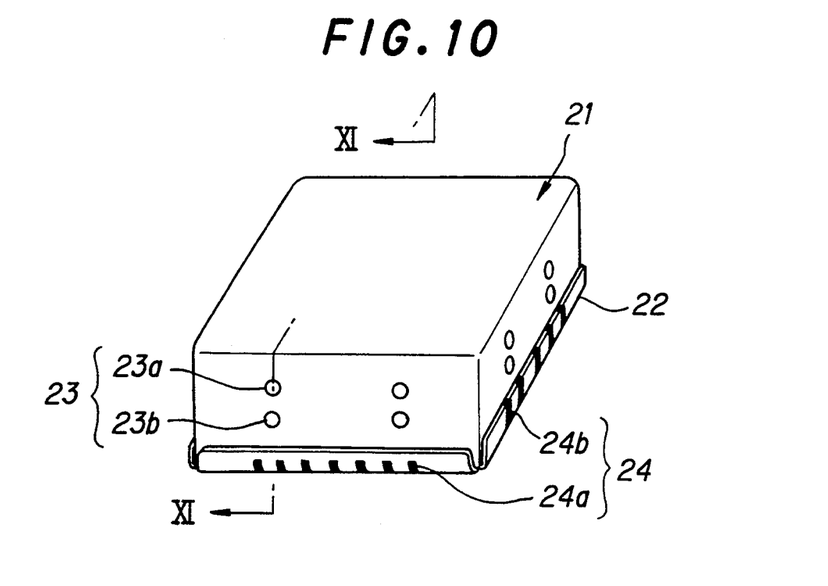
FIG. 10 is a schematic perspective view showing as inverted the enclosure member in FIG. 9.
Figure 11:
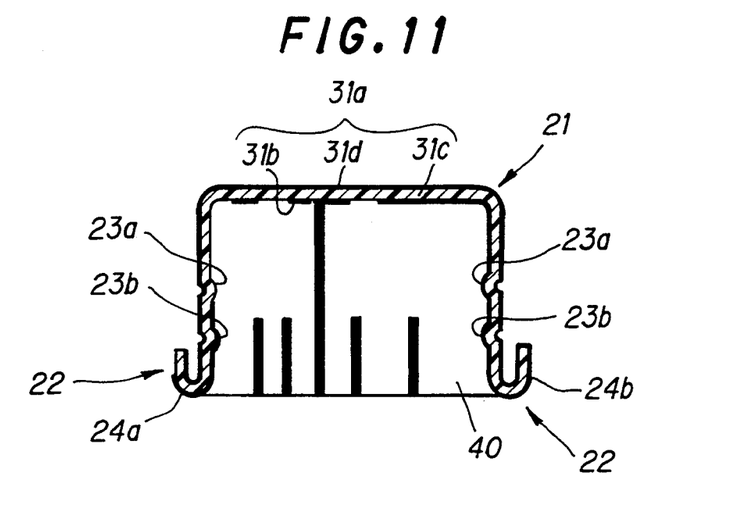
FIG. 11 is a sectional view taken along the line XI—XI in FIG. 10.

FIGS. 9 to 11 shown a second embodiment of the semiconductor device according to the present invention.

In FIG. 9, the reference numeral 21 indicates a leadless package or enclosure member which houses a double-sided mounting circuit board 26 on both sides of which a plurality of circuit elements 27 such as semiconductor chips is provided as will be discussed later. The enclosure member 21 has an opening 40 of a substantially same size as that of the double-sided mounting circuit board 26. The enclosure member 21 is formed by a single thin flat metal-base wiring board 31a having three layers, that is, a nickel silver film 31b, polyimide resin 31c and copper foil 31d (the later structure is not shown). The thickness of each layer in this embodiment is as follows. The nickel silver film 31b as outer surface is 0.15 mm thick, the polyimide resin 31c as insulation layer is 20 $\mu$m and the copper foil 31d as inner surface is 35 $\mu$m. In the first embodiment, the metal-base wiring board is used which has an aluminum film as the base layer since it can be easily drawn, but in this second embodiment, a metal-base wiring board 31a is used which has the nickel silver film 31b as the base layer since it needs no rust-proofing process, is highly elastic and provides a higher shielding effect. The insulation resin layer may be made of a resin in an epoxy family in stead of the polyimide family, as in the first embodiment.

The enclosure member 21 made of such materials is formed by cutting, by punching, a metal-base wiring board 31a along a predetermined development line, bending or drawing into the form of a box. The wiring conductors 24 which will be described later are formed as etched beforehand on the copper foil 31d of the metal-base wiring board before bent or drawn.

The inner surface of the enclosure member 1 is defined by the wiring conductors 24 and the polyimide resin on which the conductors are formed, and the outer surface is defined by the entire nickel silver film 31b to form an electromagnetic shielding surface.

Figure 12:
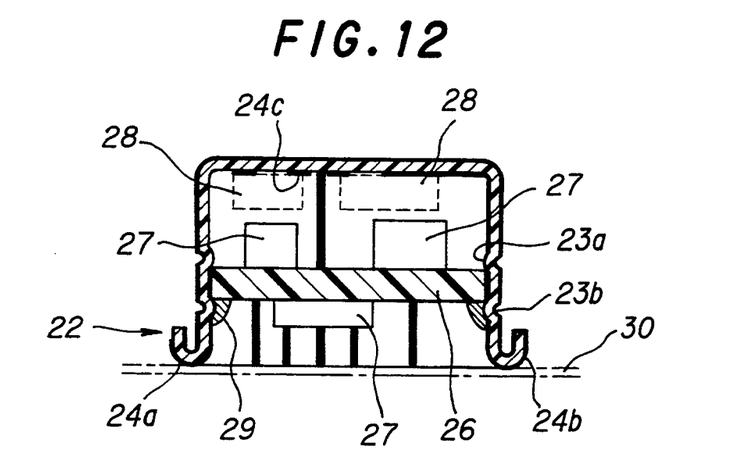
FIG. 12 is a schematic sectional view showing the installation of a circuit board on both sides of which electronic parts are mounted in the enclosure member.

The wiring conductors 24 include a plurality of circuit connecting conductors 24a and grounding conductors 24b. The circuit connecting conductors 24a and grounding conductors 24b have each the one end thereof so disposed inside the enclosure member 21 as to be connected to the terminal electrode formed on the circumferential edge of the double-sided mounting circuit board 26 and which are connected to a circuit element 27 such as semiconductor chip or the like, while the other end is so disposed outside over the opening end of the enclosure member 21 as to be connected to the wiring electrode on the motherboard 30. More particularly, the grounding conductors 24b are extended to outside the enclosure member 21 and connected to the nickel silver film 31b as the outer surface of the enclosure member 21. These grounding conductors 24b are so formed already on the metal-base wiring board 31a as to have a length over the cutting line. When the metal-base wiring board 31a is cut as punched, the grounding conductors 31a remain as not cut off but as flattened to have an electrical contact with the nickel silver film 31b. Also, the enclosure member 21 may have an internal wiring conductor 24c formed on the bottom thereof. Thus, a circuit element 28 may be disposed inside the enclosure member 21 as well as on the double-sided mounting circuit board 26 as shown in FIG. 12. The internal wiring conductor 24c may be so formed as to connect the circuit element 28 to the terminal electrodes of the double-sided mounting circuit board 26, or it may be so extended to outside over the opening end of the enclosure member 21 as to be connected to the wiring electrodes on the motherboard 30.

The enclosure member 21 has formed on the lateral wall thereof a plurality of projections 23 which are used to position the double-sided mounting circuit board 26 in place inside the enclosure member 21. In this embodiment, each lateral wall has formed thereon two projections 23a which engage on the upper surface of the double-sided mounting circuit board 26 and two projections 23b which engage the rear surface of the double-sided mounting circuit board 26. The double-sided mounting circuit board 26 is inserted from the opening 40 and fixed as fitted between the projections 23a and 23b. Since the enclosure member 21 is made from a metal-base wiring board 31a having the nickel silver film 31b as the base layer, the double-sided mounting circuit board 26 can be easily fitted between the projections 23a and 23b. Namely, the circumferential end face of the double-sided mounting circuit board 26 abuts the lateral wall of the enclosure member 21 so that the upper and rear surfaces of the latter will be blocked by the plurality of projections 23a and 23b from being moved up and down. The terminal electrodes formed on the circumferential edge of the double-sided mounting circuit board 26 fitted between the projections 23a and 23b, and connected to the circuit element 27 such as semiconductor chip or the like, are in contact and connected as soldered with the ends, respectively, of the circuit connecting conductors 24a.

The opening end of the enclosure member 1 is bent outwardly and over the outer surface thereof as shown in FIG. 11 to form a bend 22 having a U-shaped section. The wiring conductors 24 including the circuit connecting conductors 24a are extended outwardly from inside the enclosure member 21 through the bend 22. When the enclosure member 21 is mounted on the motherboard 30 with the opening 40 directed downward, the wiring conductors 24 are in substantially line contact with the wiring electrodes on the motherboard 30 along the bending line of the bend 22 and soldered as they are to the wiring electrodes on the motherboard 30.

This soldering may be done by the reflow soldering process as in the first embodiment, whereby a satisfactory physical contact and electrical connection can be assured between the wiring conductors 24 and the wiring electrodes on the motherboard 30. Also, a small projection may be formed in a position along the bending line of the bend 22 correspondingly to each wiring conductor 24. These small projections have a smaller curvature than the bend 22 has and the wiring conductors 24 can have substantial point contact with the printed wires on the motherboard 30. The practical advantage of such small projections provided in positions along the bending line of the bend 22 lies in that the plurality of wiring conductors 24 are disposed with a fine pitch and it is possible for the excess melted solder to escape in a direction along the bending line of the bend 22 as well as in a direction perpendicular to that direction, thereby permitting to block a solder bridge from being formed between the wiring conductors 24.

As having been described in the foregoing, in the second embodiment of the semiconductor device according to the present invention, a double-sided mounting circuit board and electronic parts can be fixed as closely packed within the box-shaped enclosure member having itself an electromagnetic shield and the enclosure member itself can be surface-mounted on the motherboard. Such fixation and surface-mounting can be done by the reflow soldering process. Therefore, the assembling time can be considerably reduced and thus manufacturing costs can be decreased. Further, since the box-shaped enclosure members can be formed from a single thin, flat metal-base wiring board and not only the double-sided mounting circuit board but also other electronic parts can be disposed as closely packed inside the enclosure member, the packaging density is considerably improved.

Having described our invention as related to the embodiments shown in the accompanying drawings, it is our intention that the invention be not limited by any of the details of description, unless otherwise specified, but rather be constructed broadly within its spirit and scope as set out in the accompanying claims.

What is claimed is:

1. A semiconductor device having a leadless package so formed as to house therein at least one electronic semiconductor part which is at most only minimally passivated and to be surface-mounted on a circuit board, said leadless package having an enclosure member formed of a sheet-type laminate, having an insulation layer, and first and second conductive layers on respective opposite sides of the insulation layer, which has been deformed into a one-piece tray shape having a circumferentially bounded concavity with a substantially flat bottom and which is defined by said first conductive layer, wherein said concavity has a substantially flat edge along an opening of said tray shape and houses therein said at least one electronic semiconductor part; and wherein said second conductive layer forms an electromagnetic shielding surface which is held at ground potential;

wherein said first conductive layer has a plurality of wiring conductors formed thereon, first ends of which are connected to respective terminal electrodes of said semiconductor part while second ends thereof extend to a circumferential edge of said concavity so as to be connected to terminal electrodes corresponding to electronic parts on said circuit board;

wherein said semiconductor part is resin-molded in said concavity; and wherein there is formed between said bottom and circumferential edge of said concavity a substantially flat step correspondingly to the position of terminal electrodes of said semiconductor part, said first ends of said wiring conductors being disposed on said step.

2. A semiconductor device according to claim 1, wherein said circumferential edge has formed thereon a projection which assures a secure electrical connection, as soldered, between said second ends of the wiring conductors and the terminal electrodes corresponding to the electronic parts on said circuit board.

3. A semiconductor device according to claim 2, wherein said projection is extended in a direction along said circumferential edge, which permits said electrical connection to be a substantially line connection.

4. A semiconductor device according to claim 2, wherein said projection is provided with a plurality of projections, each of which is formed substantially semispheric, which permits said electrical connection to be a substantially point connection.

5. A semiconductor device according to claim 1, wherein said sheet-type laminate of which said enclosure member is formed is a composite laminate in which said insulation layer has a thickness ranging from 20 to 60 $\mu$m and in which said conductive layers on opposite sides of the insulation layer comprise, respectively, a copper foil ranging from 18 to 70 $\mu$m in thickness and a metal base ranging from 0.1 to 3.0 mm in thickness; and wherein said laminate has been deformed into said one-piece tray shape by drawing.

6. A semiconductor device according to claim 5, wherein said metal base is made of aluminum.

7. A semiconductor device having a leadless package so formed as that a double-sided mounting circuit board, on either side of which a plurality of semiconductor chips and other electronic parts are mounted, can be surface-mounted on a motherboard, said package comprising an enclosure member formed of a sheet-type laminate, having an insulation layer, and first and second conductive layers on respective opposite sides of the insulation layer, which has been deformed into a one-piece box shape having a space which is defined by a part locating surface of said first conductive layer, said enclosure member housing said double-sided mounting circuit board therein, being open substantially at one side thereof and having an open edge which has been bent and folded outwardly;

wherein said enclosure member comprises a means for positioning and fixing said double-sided mounting circuit board in a predetermined place and having a plurality of wiring conductors so formed on said first conductive layer as to be connected to terminal electrodes of the plurality of semiconductor chips on said double-sided mounting circuit board part and extended to said bent open edge, said wiring conductors on said bent open edge forming terminal electrodes which are to be connected to said motherboard; and said second conductive layer forming an outer circumferential surface of said enclosure member and being so held at ground potential as to form an electromagnetic shield, wherein said semiconductor part is resin-molded in said concavity.

8. A semiconductor device according to claim 7, wherein a plurality of projecting members are so arranged in said enclosure member as to engage upper and lower surfaces of said double-sided mounting circuit board as said means for fixing.

9. A semiconductor device according to claim 7, wherein said bend has a nearly U-shaped section.

* * * * *